(12) United States Patent
Donnelly, Jr. et al.

(10) Patent No.: US 6,511,872 B1
(45) Date of Patent: Jan. 28, 2003

(54) DEVICE HAVING A HIGH DIELECTRIC CONSTANT MATERIAL AND A METHOD OF MANUFACTURE THEREOF

(75) Inventors: Vincent M. Donnelly, Jr., Berkeley Heights, NJ (US); Avinoam Kornblit, Highland Park, NJ (US); Kalman Pelhos, New Brunswick, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/902,358

(22) Filed: Jul. 10, 2001

(51) Int. Cl.[7] ............... H01L 21/336; H01L 21/8234
(52) U.S. Cl. ........................ 438/197; 438/722
(58) Field of Search ................. 438/197, 202, 438/266, 582, 624, 656, 680, 681, 683, 685, 704, 722, 785, 933

(56) References Cited

U.S. PATENT DOCUMENTS

| | | | | |
|---|---|---|---|---|
| 4,207,105 A | * | 6/1980 | Sato ........................... | 439/432 |
| 6,187,168 B1 | * | 2/2001 | LaCamera et al. .......... | 205/367 |
| 6,322,849 B2 | * | 11/2001 | Joshi et al. ................. | 427/96 |
| 6,396,092 B1 | * | 5/2002 | Takatani et al. ............ | 257/295 |

* cited by examiner

*Primary Examiner*—David Nelms
*Assistant Examiner*—David Nhu

(57) ABSTRACT

The present invention provides a method of manufacturing a semiconductor device. The method includes depositing a metal oxide containing a dopant and having a high dielectric constant on a substrate; wherein the metal is aluminum or silicon and the dopant is zirconium or hafnium and etching the doped metal oxide with a plasma containing a halogenated compound.

15 Claims, 8 Drawing Sheets

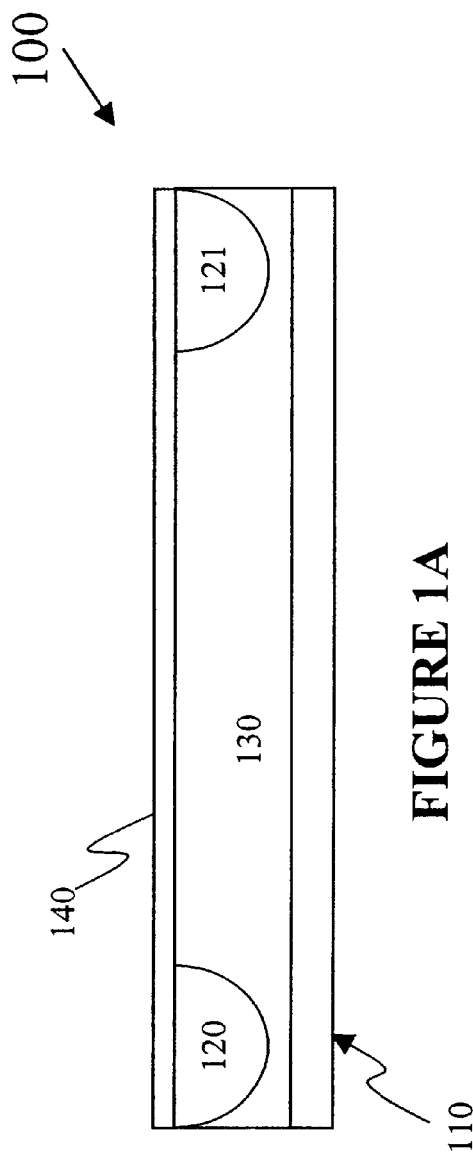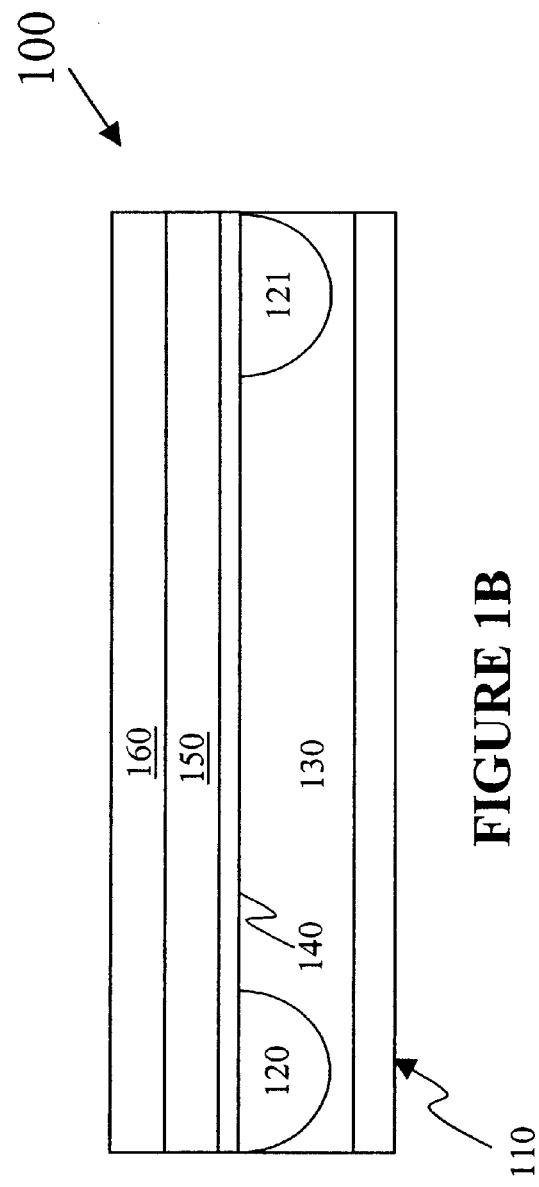

DEVICE HAVING A HIGH DIELECTRIC CONSTANT MATERIAL AND A METHOD OF MANUFACTURE THEREOF

TECHNICAL FIELD OF THE INVENTION

The present invention is directed, in general, to semiconductor devices and, more specifically, to a method of etching a dielectric having a high dielectric constant.

BACKGROUND OF THE INVENTION

As is well known, various semiconductor devices and structures are fabricated on semiconductor wafers in order to form operative integrated circuits (IC's). These various semiconductor devices and structures allow fast, reliable, and inexpensive IC's to be manufactured for today's competitive computer and telecommunication markets. To keep such IC's inexpensive, the semiconductor manufacturing industry continually strives to economize each step of the IC fabrication process to the greatest extent, while maintaining the highest degree of quality and functionality possible.

The use of different methods for manufacturing semiconductor devices has reached phenomenal proportions over the last decade. Equally phenomenal has been achievement of the ever-decreasing size of the semiconductor devices themselves. Such decreasing device dimensions inherently require that the thickness of dielectrics such as gate oxides, with in metal-oxide semiconductor field effect transistors (MOSFET), shrink as well. It is particularly desirable to reduce the thickness of the gate oxide in these devices, since the drive current in semiconductor devices increases as the thickness of the gate oxide decreases. Unfortunately, along with the trend toward thinner gate oxides comes the increased risk of reduced quality of the dielectric gate oxide layers. Even where ultra-thin high quality conventional dielectrics may be produced, high leakage currents and poor reliability limit their thickness to a value too large for the high-speed switching required today.

In response to these concerns, the use of dielectric films having a high dielectric constant (K) has gained popularity. Such high-K dielectric materials and processes for their incorporation into semiconductor devices and IC's are being developed to eventually replace conventional gate oxides. In addition to a high-K value, new gate oxide candidates must satisfy other criteria if they are to be integrated into standard manufacturing processes. These include thermodynamic stability on silicon, low leakage current, and conformal growth. Many high-K dielectrics (10<K<80) have been proposed, such as $TiO_2$, $Ta_2O_5$, $SrTiO_3$, $Al_2O_3$, $HfO_2$ and $ZrO_2$; however, all fail some of the criteria listed above.

Another particular problem that inhibits the use of current high dielectric constant gate materials is the lack of a suitable dry etching process available to remove the gate dielectric layer after the gates have been formed. This process must remove the dielectric layer with a selectivity that is suitable with respect to the underlying substrate. Etchant selectivity refers to the relative rate at which the etchant removes various materials that may make up a semiconductor device. Thus, in a process of forming a gate by a current etching process, the gate dielectric layer may not be suitably etched before the underlying silicon is etched.

Accordingly, what is needed in the art is a method of forming a semiconductor device having a high dielectric constant oxide that may be satisfactorily etched and a method of manufacture therefor that does not suffer from the deficiencies of the prior art.

SUMMARY OF THE INVENTION

To address the above-discussed deficiencies of the prior art, the present invention provides a method of manufacturing a semiconductor device. In one embodiment, the method comprises depositing a metal oxide containing a dopant and having a high dielectric constant on a substrate; wherein the metal is aluminum or silicon and the dopant is zirconium or hafnium and etching the doped metal oxide with a plasma containing a halogenated compound.

In another aspect, the present invention provides a method of manufacturing an integrated circuit. In this particular embodiment, the method includes metal depositing a metal oxide containing a dopant and having a high dielectric constant on a substrate; wherein the metal is aluminum or silicon and the dopant is zirconium or hafnium, etching the doped metal oxide with a plasma containing a halogenated compound and forming interconnects that interconnect the active devices to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 1A illustrates a sectional view of a partially completed device constructed according to the principles of the present invention;

FIG. 1B illustrates a schematic cross-section of the partially completed device of FIG. 1A after having a gate layer and a protective layer deposited thereon;

DETAILED DESCRIPTION

Figure 1C:
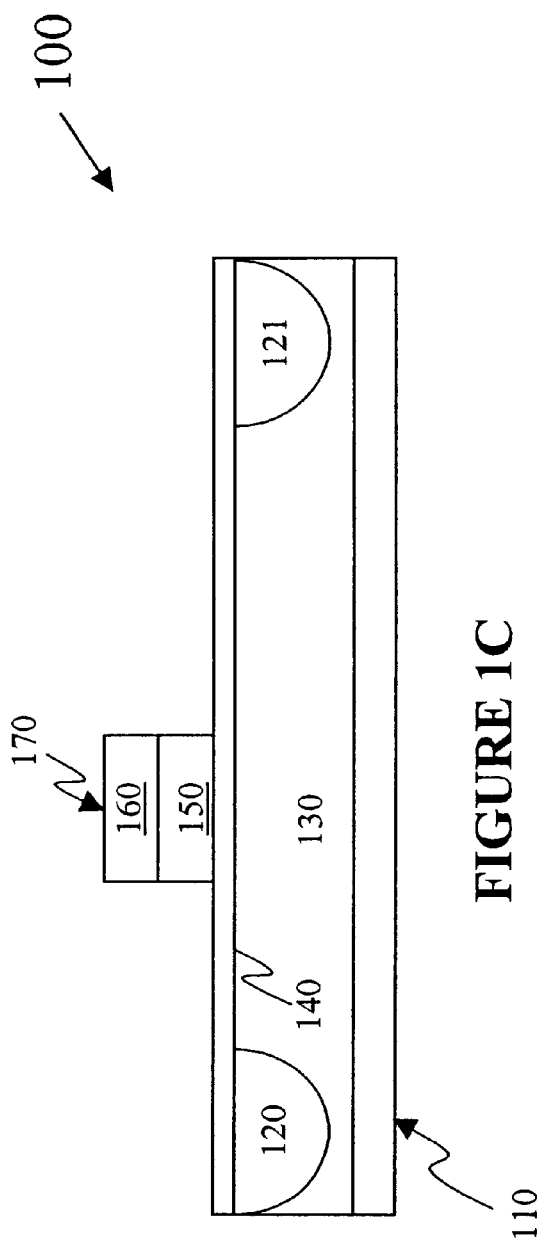
FIG. 1C illustrates a schematic cross-section of the partially completed device of FIG. 1B after etching of the gate layer and the protective layer.

Referring initially to FIG. 1A, there is illustrated a schematic representation of a partially constructed semiconductor device 100, that is used to construct a semiconductor device in accordance with the principles of the present invention. The partially constructed semiconductor device 100 includes a substrate 110 having isolation regions 120, 121 formed thereover. In one embodiment the substrate 110 may comprise silicon, germanium, or gallium arsenide. However, any semiconductor material suitable for acting as a substrate that is currently known or hereafter discovered is within the scope of the present invention. One skilled in the art will readily understand how such isolation regions may be formed. The semiconductor device 100 may further include a conventionally formed tub region 130 located in the substrate 110. The tub region 130 may be doped with either a P or an N type of dopant. While the tub region 130 may be either P or N type doped, for ease of discussion the remaining FIGUREs will be discussed as having a tub region 130 being P-type doped. However, one skilled in the art will understand that a device having an N-tub region may be formed analogously.

The semiconductor device 100 also includes a gate dielectric layer 140 formed thereover. In an advantageous embodiment, the gate dielectric layer 140 includes a Group 13 or Group 14 metal oxide that contains a dopant and that has a high dielectric constant, which in the present invention includes dielectrics that have a dielectric constant greater than that of silicon dioxide, which ranges from about 4.4 to about 4.6. In a more advantageous embodiment, the dielectric constant may range from about 6 to about 42. The Group 13 metal may include boron, aluminum, gallium, indium or thallium. In a particularly advantageous embodiment, the Group 13 metal in the metal oxide of gate dielectric layer 140 includes aluminum. Useful Group 14 metals include carbon, silicon, germanium, tin and lead. However, in a particularly advantageous embodiment the Group 14 metal in the metal oxide of gate dielectric layer 140 includes silicon.

The dopant in the gate dielectric layer 140 may include any early transition metal element including a lanthanide that may be added to the metal oxide to alter a property of the gate dielectric layer 140. A dopant may be interstitially located in the metal oxide, located at a defect site, substitutionally replace metal atoms of the oxide, or be incorporated in any other manner into the metal oxide. The dopant concentration may vary over a wide range and may even be greater than the concentration of the metal of the metal oxide. Particularly useful dopants include titanium, zirconium, hafnium, yttrium, lanthanum, praseodymium, neodymium or gadolinium.

The gate dielectric layer 140, in an exemplarily embodiment, may have a composition determined by the formula $M_{(1-x)}D_xO_y$, where M is the Group 13 or Group 14 element and D is the dopant. In one advantageous embodiment, the metal of the metal oxide that forms gate dielectric layer 140 is aluminum and the dopant is zirconium. In such embodiments, the gate dielectric layer has a composition according to the formula $Al_{(1-x)}Zr_xO_y$, where x may range from about 0 to about 1 and y may range from about 1.5 to about 2.0. In more specific embodiments, however, the x may range from about 0.4 to about 0.9 and y may range from about 1.7 to about 1.95. In yet a more specific embodiment x may be about 0.8 and y may be about 1.9.

The gate dielectric layer 140 may be formed by any method suitable for forming a gate dielectric layer. However, advantageous gate dielectric layers 140 may be formed by sputter deposition in an oxygen ambient. The sputtering target may include the metal and the dopant in ratios suitable for forming a gate dielectric layer 140 having the desired composition. Thus, suitable target materials would include alloys of early transition metals and Group 13 or Group 14 elements. In certain embodiments the target includes aluminum and zirconium wherein the ratio of aluminum to zirconium may range from about 0:1 to about 1:0. However, in certain other embodiments the ratio of aluminum to zirconium may range from about 3:2 to about 1:9. In an advantageous embodiment the target has an aluminum to zirconium ratio of about 1:4. Other conditions for forming a gate dielectric layer 130 are conventional and are known to one skilled in the art.

Now turning to FIG. 1B, there is illustrated an embodiment of the present invention wherein a gate layer 150 may be formed over the gate dielectric layer 140 and isolation regions 120, 121. Any material suitable for forming a gate may be used for the formation of gate layer 150. However, particularly useful material for gate layer 150 may comprise silicon. Such a gate layer 150 may be formed by any means known to one skilled in the art. Certain embodiments of the present invention may also include a protective layer 160 formed over the gate layer 150. The protective layer 160 may be conductive and could be used to reduce the sheet resistance. In one embodiment the protective layer 160 may comprise tungsten silicide. However, any material suitable for forming a protective layer over a gate is within the scope of the present invention.

Referring now to FIG. 1C, the gate layer 150 may be masked and etched. In those embodiments having a protective layer 160, the protective layer 160 may be masked and etched as well. This etching and masking may be performed by any means known to one skilled in the art to form the gate 170 as illustrated in FIG. 1C.

Figure 1D:
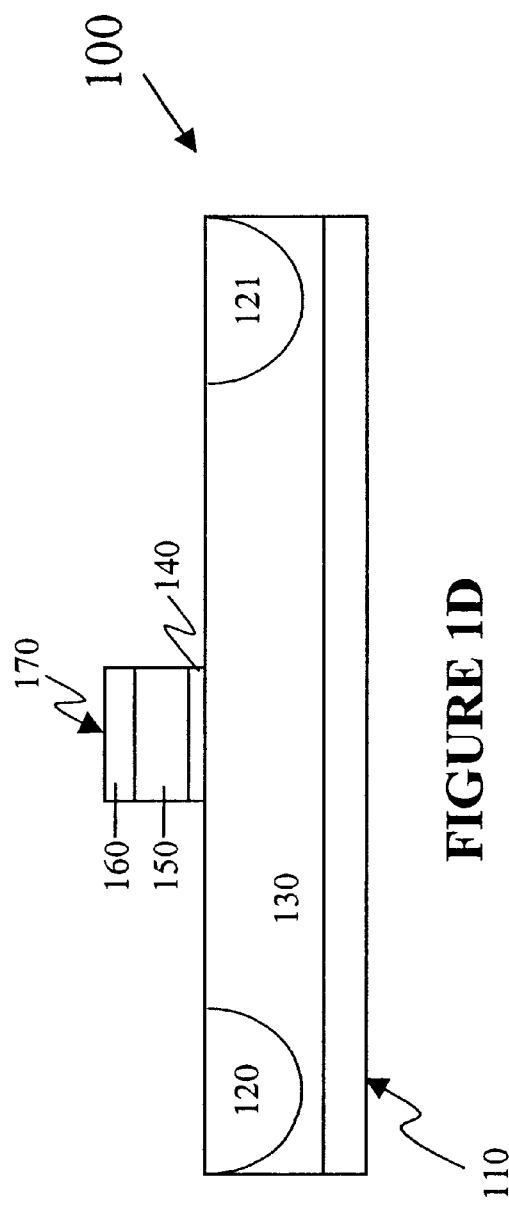
FIG. 1D illustrates a schematic cross-section of an embodiment of a device constructed according to the present invention after patterning a gate dielectric layer.

Etching of the gate requires an etch mask (not shown) formed in a pattern that allows etching to occur in desired regions while others are protected. The application of etch masks to allow such etching is well-known in the art. Once the gate 170 has been formed, the gate dielectric layer 140 may be etched in the exposed areas to form a structure as illustrated in FIG. 1D. The gate dielectric layer 140 may be etched in a low-pressure, high-intensity helical resonator plasma reactor operated at about 10 mTorr, as measured by a capacitance manometer. The helical resonator reactor may be operated at a frequency of about 11–12 MHz and a net power of about 200 watts, yielding an ion density of about $4 \times 10^1$ ions/cm$^3$ as measured by a Scientific Systems Langmuir probe about 2 cm from the wafer. Once generated, the plasma in the helical resonator, may be confined to desired regions of the reactor by 100 G electromagnets.

The plasma in the helical resonator includes a halogenated etchant. In certain embodiments the etchant may be supplied at a rate of about 8 sccm. However, one skilled in the art may experimentally determine alternate optimal flow rates. Use of such other flow rates does not depart from the scope of the present invention. In certain embodiments, the halogenated etchant includes boron trichloride, $BCl_3$. In other embodiments, the halogenated etchant may also include chlorine, $Cl_2$. In such embodiments, the $Cl_2$ may be supplied at a flow rate of about 0 sccm to about 8 sccm. However, one may experimentally determine optimal mixtures of etchant to obtain desired etching rates and etching selectivity. In certain embodiments, the etching described above may also be performed using a substrate bias. In such embodiments, a bias may be applied to the substrate 110 of the semiconductor device 100 to vary the average incident ion energy of the etchant. One skilled in the art readily understands how to apply a bias to a substrate. However, in certain embodiments, the bias may be applied by capacitively coupling the substrate to an RF power source. The RF power source, operated at about 14 MHZ and a power up to about 20 watts, may supply a bias ranging from about −250 volts to about 0 volts, to the substrate. In those embodiments where no bias is desired, the substrate 110 is grounded and the RF power supply is not used.

Figure 1E:
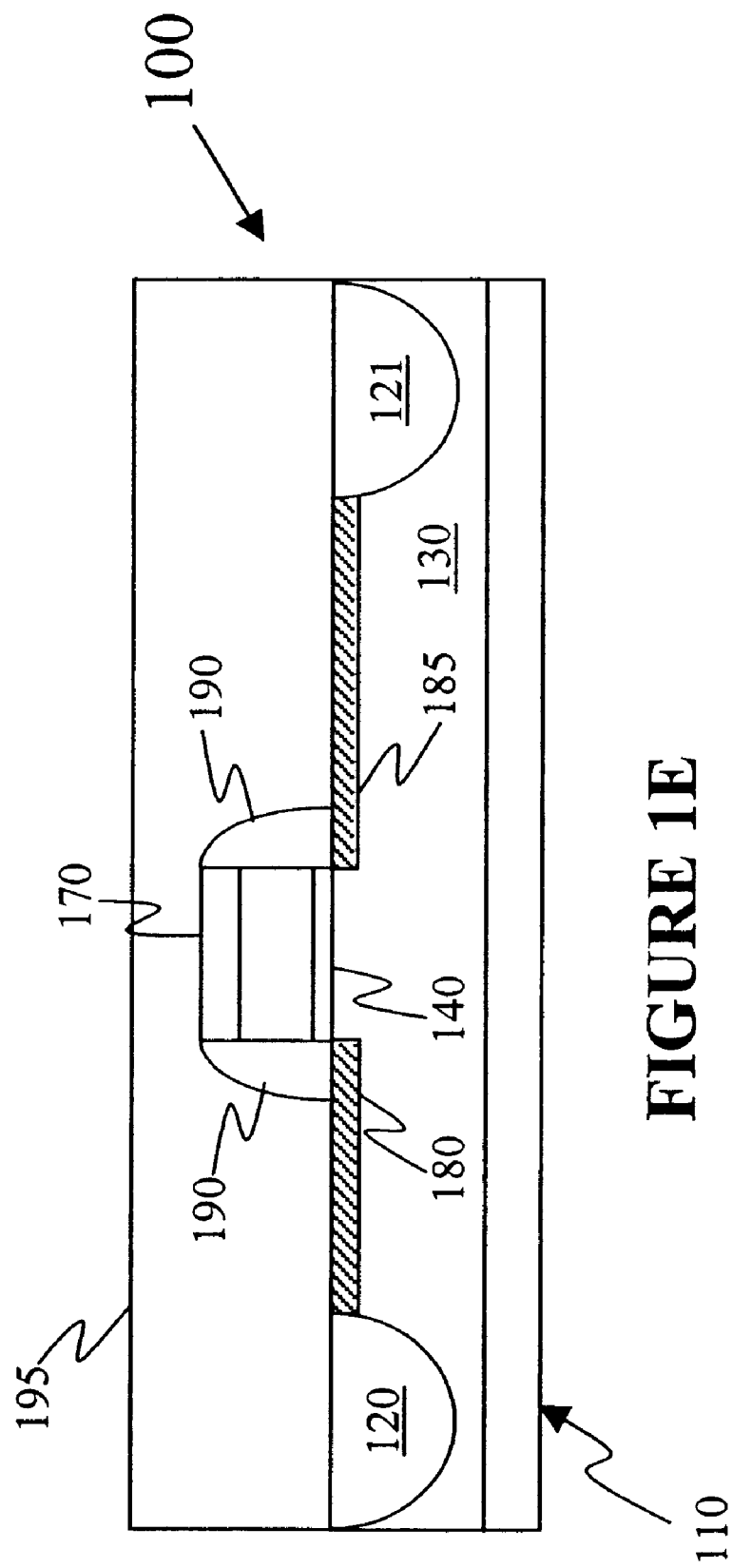
FIG. 1E illustrates a schematic cross-section of an embodiment of a device constructed according to the present invention after the formation of sidewall spacers, source and drain regions, and an interlevel dielectric.

With reference to FIG. 1E, source 180 and drain 185 regions may also be formed in the tub region 130. Such source 180 and drain 185 regions may be formed after forming the gate 170. In particular embodiments, the source and drain regions 180, 185, may be formed by implanting a dopant comprising boron or arsenic. Regardless of the particular dopant, source 180 and drain 185 regions may be formed by any means known in the art. Sidewall spacers 190 may also be formed according to conventional means. One such method includes depositing and etching tetraethyl orthosilicate (TEOS)glass. The device 100 may be completed by forming an interlevel dielectric layer 195 over the exposed regions of the device by conventional means.

Figure 2:
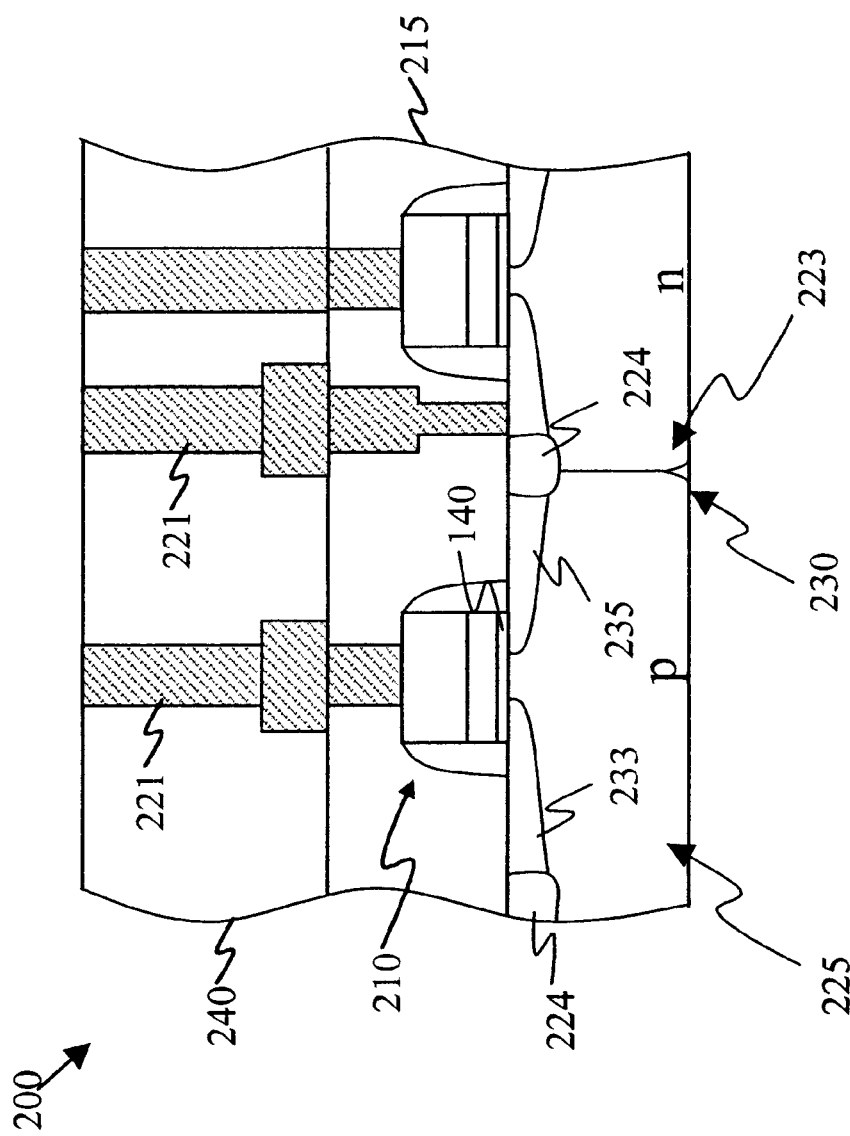
FIG. 2 illustrates a schematic representation of an integrated circuit fabricated according to the principles of the present invention.

Turning briefly to FIG. 2, there is illustrated a cross-sectional view of a conventional integrated circuit 200, that might be manufactured according to the principles of the present invention. The integrated circuit 200 may include CMOS devices, BiCMOS devices, Bipolar devices, EEPROM devices, including Flash EPROMS, or any other type of similar device. Also shown in FIG. 2 are exemplary components of a conventional integrated circuit 200, including: transistors 210, having a gate dielectric layer 140 according to the present invention, a first dielectric layer 215, and a second interlevel dielectric layer 240. Interconnect structures 221 form part of an interconnect system that electrically connects the transistor 210 to other devices to form the integrated circuit 200. Moreover, one having skill in the art knows how to electrically connect the transistors 210 to complete the integrated circuit 200. Also illustrated, are conventionally formed tubs, 223, 225, isolation regions, 224, source regions 233 and drain regions 235, all located over a substrate 230.

Figure 3:
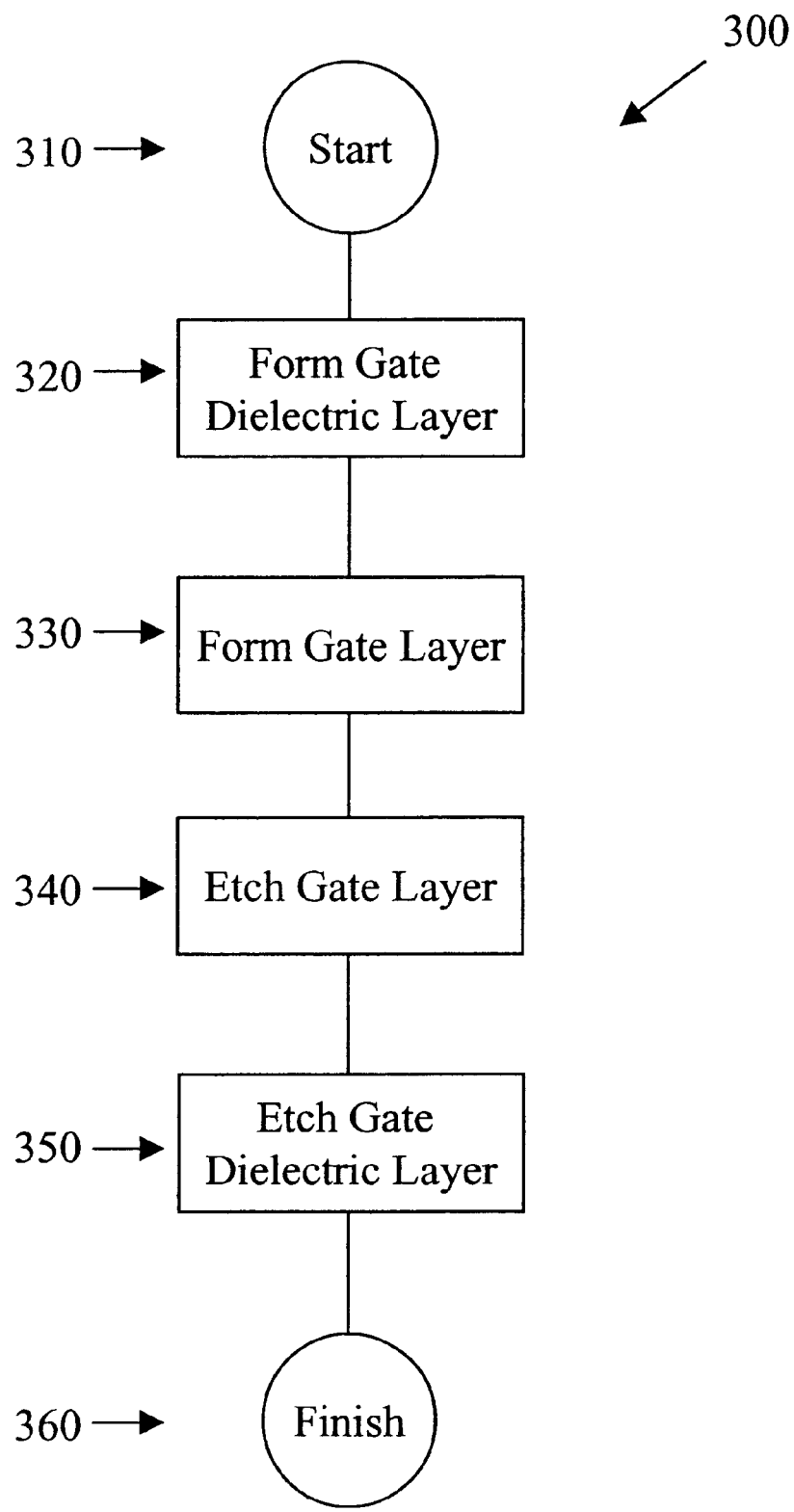
FIG. 3 illustrates a flow-diagram for an illustrative method of forming a semiconductor device according to the principles of the present invention.

Now turning to FIG. 3 with continued reference to FIGS. 1A–E, there is illustrated a flow diagram for a representative method of manufacturing a semiconductor device according to the principles of the present invention. Such a method may begin at Start Step 310, where the substrate 110, having isolation regions 120, 121 and tub region 130 formed therein, is positioned in a conventional semiconductor manufacturing device. Start Step 310 may be followed by a Form Gate Dielectric Layer Step 320 where the gate dielectric layer 140 is formed over desired portions of the surface of substrate 110. After formation of a desired thickness of gate dielectric layer 140 during the Form Gate Dielectric Layer Step 320, Gate Layer Formation Step 330 may be performed and may include forming the gate layer 150 and the protective layer 160. Gate Etch Step 340 may then be employed to form the gate 170 which is followed by Gate Dielectric Layer Etch Step 350. The process may be completed at Finish Step 360. Finish Step 360 may include forming the source 180 and drain 185 regions as well as forming the side wall spacers 190 and the interlevel dielectric 195. Finish Step 360 may also include those steps necessary to complete a conventional integrated circuit having a semiconductor device 100 therein.

EXAMPLES

Semiconductor devices comprising the silicon substrate 110, and exemplary gate dielectric layers 140 were etched to determine the suitability of such gate dielectric layers 140 for use in semiconductor devices and integrated circuits. The effects of the etchant and gate dielectric layer compositions, as well as those of applying a substrate bias where studied to better understand how such layers may be processed.

Figure 4:
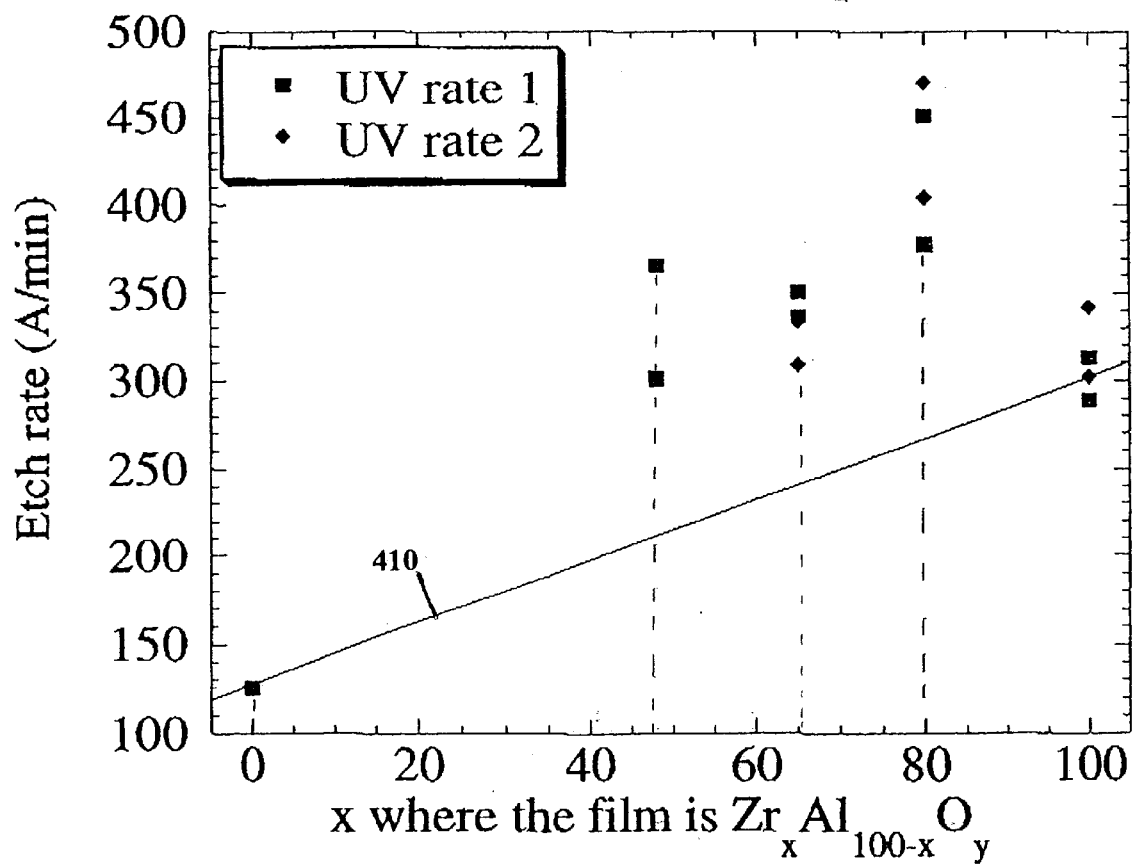
FIG. 4 illustrates the etching rate as a function of film composition for exemplary gate dielectric layers of the present invention.

Referring now to FIG. 4, there is indicated the rate of etching as a function of the composition of the gate dielectric layer 140 in boron trichloride. As indicated, the etching rate of $Al_2O_3$ (where x is equal to zero) is about 12.8 nm/minute. Likewise, the etching rate of $ZrO_2$ (when x is equal to 100) ranges from about 27.0 nm/minute to about 35.0 nm/minute. Thus, one skilled in the art would expect the etching rates for intermediate compositions to be given approximately by line 410. However, films having compositions of about $Al_{0.53}Zr_{0.47}O_{1.74}$ and $Al_{0.35}Zr_{0.65}O_{1.30}$ exhibited etching rates ranging from about 30.0 nm/minute to about 36.5 nm/minute and from about 30.5 nm/minute to about 35.0 nm/minute, respectively. In one exemplary experiment, the etching rate of a film having a composition of about $Al_{0.19}Zr_{0.81}O_{1.50}$ ranged from about 38.0 nm/minute to about 47.0 nm/minute. Surprisingly, the etching rates of such intermediate compositions are significantly higher than those of either $Al_2O_3$ or ZrO2. Thus, a gate dielectric layer 140 having such an intermediate composition will show improved etching selectivity in the presence the substrate, thereby reducing problems, such as etching of the silicon in the tub region 130, after etching of the gate dielectric layer 140 is complete. It is desirable to minimize the etching of the tub region 130 since the implantation of the source and drain regions is quite shallow in modern devices.

Figure 5:
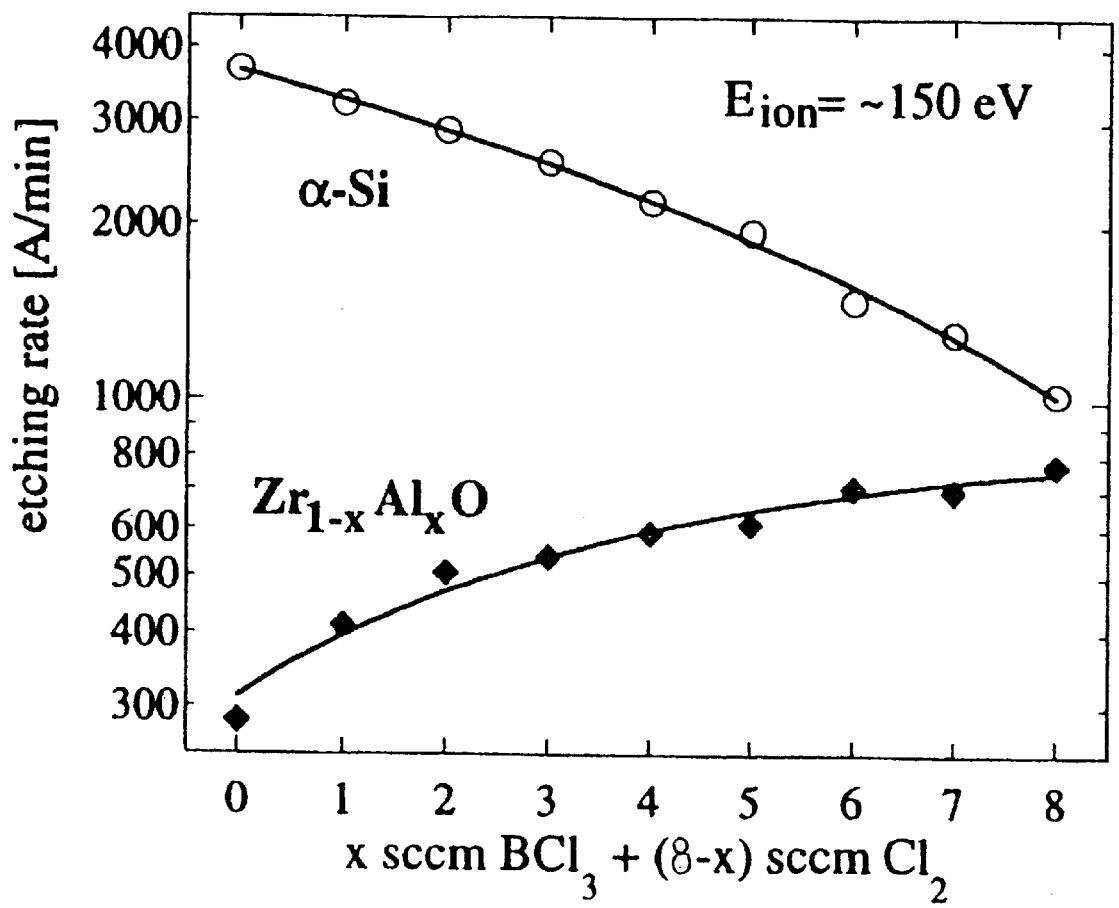
FIG. 5 illustrates the effect of etchant composition on the etch rate of α-silicon and an exemplary gate dielectric layer of the present invention.

Next the etching rate as a function of etchant composition for both an α-silicon substrate and a dielectric film where the ratio of aluminum to zirconium is about 3.2∓0.8 were investigated. In general, α-Si etching rate is usually equal to or slightly greater than the etching rate of bulk silicon. As FIG. 5 indicates, chlorine selectively etches α-silicon much faster than the gate dielectric layer 140. However, the addition of $BCl_3$ to the etch mixture improved the etch selectivity. When the etchant is pure $BCl_3$, α-silicon and the gate dielectric layer 140 are etched at approximately equal rates. Thus, when a gate dielectric layer 140 of the present invention is etched in the presence of $BCl_3$, the selectivity of the etching process may be adjusted by adjusting the ratio of $BCl_3$:$Cl_2$ in the etch mixture. Such improvements in selectivity allow the etching process to desirably remove portions of the exemplary gate dielectric layer 140 in the presence of the substrate 110.

Figure 6:
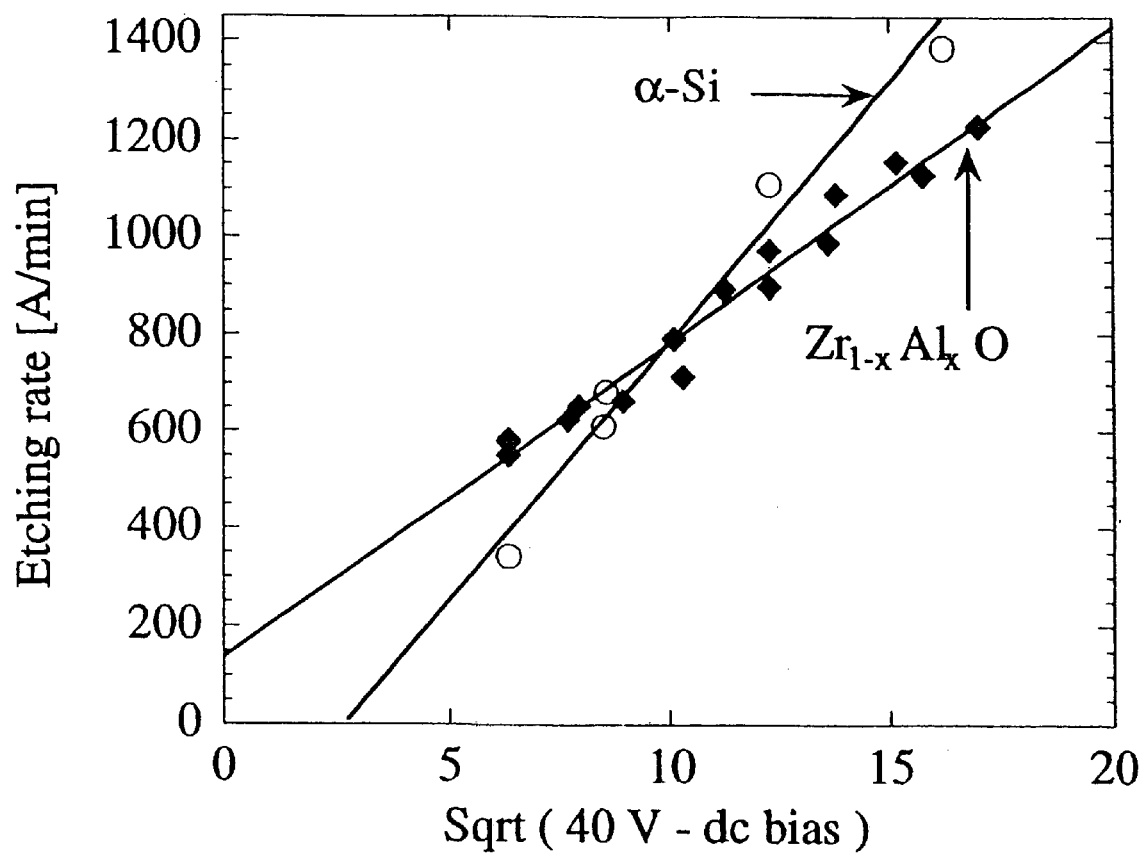
FIG. 6 illustrates the effect of substrate bias on the BCl$_3$-etching rate of silicon and an exemplary gate dielectric layer of the present invention.

The effect of substrate bias on the etching rate for silicon and an exemplary gate dielectric film in $BCl_3$ was also investigated. FIG. 6 shows a graphical representation of the measured etching rates, where the x-axis is given by the square root of the plasma potential minus the substrate bias. One skilled in the art will recognize that this representation assumes an idealized plasma of monoenergetic ions. However, typical ion energies in a plasma are at least bimodally distributed. Thus, one skilled in art understands that the etching rates indicated in FIG. 6 may be systematically too low. However, because the rates are systematically underestimated, the data of FIG. 6 may still give information regarding selectivity. For instance, FIG. 6 indicates that selectively etching an exemplary gate dielectric layer 140 of the present invention in the presence of a silicon substrate is improved at lower substrate biases. For example, when bias of about −4 volts is applied to the substrate, the etching rate for the exemplary gate dielectric layer is about 59.0 nm/minute while that for α-silicon is only about 35.0 nm/minute, indicating that the gate dielectric layer 140 is removed about 1.6 times faster than the silicon. FIG. 6 also indicates that at a substrate bias of about −60 volts the etching rates for the exemplary gate dielectric layer 140 and α-silicon are approximately equal. At more-negative substrate biases the etching of silicon will be faster than that of the exemplary gate dielectric layer 140. Thus, selectively etching the exemplary gate dielectric layer 140 at low substrate bias further indicates that problems associated with etching a gate dielectric layer in the presence of a substrate may be further reduced by etching a gate dielectric layer of the present invention at a low substrate bias.

Thus, one skilled in the art will appreciate the flexibility offered by the present invention. The composition of the gate dielectric layer 140 may be adjusted to yield desirable electrical properties while improving etching selectivity. Additionally, the etchant composition and substrate bias may be varied to optimize the etching process.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    depositing a metal oxide containing a dopant and having a high dielectric constant on a substrate; wherein the metal is aluminum or silicon and the dopant is zirconium or hafnium; and
    etching the doped metal oxide with a plasma containing a halogenated compound.

2. The method as recited in claim 1 wherein the metal is aluminum and the dopant is zirconium.

3. The method as recited in claim 2 wherein the metal oxide has a general formula: $Al_{(1-x)}Zr_xO_y$, wherein x ranges from about 0 to about 1 and y ranges from about 1.5 to about 2.

4. The method as recited in claim 3 wherein x is about 0.8 and y is about 1.9.

5. The method as recited in claim 1 wherein the halogenated compound includes boron trichloride.

6. The method as recited in claim 1 further including applying a bias to the substrate that ranges from about 0 to about −250 volts.

7. The method as recited in claim 1 wherein the etching includes etching at a pressure of about 10 mTorr, an enchant flow rate of about 8 sccm, a frequency ranging from about 10 to about 15 MHz, and a power of about 200 watts.

8. A method of manufacturing an integrated circuit, comprising:
    depositing a metal gate oxide containing a dopant and having a high dielectric constant on a substrate; wherein the metal is aluminum or silicon and the dopant is zirconium or hafnium;
    etching the doped metal oxide with a plasma containing a halogenated compound; and
    forming active devices over the metal gate oxide.

9. The method as recited in claim 8 wherein the metal is aluminum and the dopant is zirconium.

10. The method as recited in claim 9 wherein the metal oxide has a general formula: $Al_{(1-x)}Zr_xO_y$, wherein x ranges from about 0 to about 1 and y ranges from about 1.5 to about 2.

11. The method as recited in claim 10 wherein x is about 0.8 and y is about 1.9.

12. The method as recited in claim 8 wherein the halogenated compound includes boron trichloride.

13. The method as recited in claim 8 further including applying a bias to the substrate that ranges from about 0 to about −250 volts.

14. The method as recited in claim 8 wherein the etching includes etching at a pressure of about 10 mTorr, an enchant flow rate of about 8 sccm, a frequency ranging from about 10 to about 15 MHz, and a power of about 200 watts.

15. The method as recited in claim 8 further including forming interconnects to connect the active devices and form an operative integrated circuit.

* * * * *